US011536744B2

(12) United States Patent
Hsieh et al.

(10) Patent No.: US 11,536,744 B2
(45) Date of Patent: Dec. 27, 2022

(54) PROBE CARD DEVICE AND DUAL-ARM PROBE

(71) Applicant: CHUNGHWA PRECISION TEST TECH. CO., LTD., Taoyuan (TW)

(72) Inventors: Kai-Chieh Hsieh, Taoyuan (TW); Wei-Jhih Su, Taichung (TW); Hong-Ming Chen, Taoyuan (TW); Vel Sankar Ramachandran, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/491,602

(22) Filed: Oct. 1, 2021

(65) Prior Publication Data

US 2022/0170960 A1    Jun. 2, 2022

(30) Foreign Application Priority Data

Nov. 30, 2020   (TW) .................................. 109142031

(51) Int. Cl.
*G01R 1/073*     (2006.01)
*G01R 1/067*     (2006.01)

(52) U.S. Cl.
CPC ..... *G01R 1/07314* (2013.01); *G01R 1/06716* (2013.01); *G01R 1/06733* (2013.01)

(58) Field of Classification Search
CPC ............ G01R 1/07314; G01R 1/06716; G01R 1/06733
See application file for complete search history.

(56) References Cited

U.S. PATENT DOCUMENTS

| 7,850,460 | B2 * | 12/2010 | Weiland ............. | G01R 1/07357 439/66 |
| 10,615,527 | B2 * | 4/2020 | Ou ....................... | H01R 12/714 |
| 11,226,354 | B1 * | 1/2022 | Lee ..................... | G01R 1/07314 |
| 11,460,486 | B1 * | 10/2022 | Hsieh ................. | G01R 31/2886 |
| 2012/0242363 | A1 * | 9/2012 | Breinlinger ........ | G01R 1/06716 324/756.03 |
| 2019/0004093 | A1 * | 1/2019 | DeBauche .......... | G01R 31/2851 |
| 2019/0041430 | A1 * | 2/2019 | Park ................... | G01R 1/06738 |
| 2019/0137545 | A1 * | 5/2019 | Reischl .............. | G01R 1/06716 |

FOREIGN PATENT DOCUMENTS

| JP | 2020201121 A | * | 12/2020 |
| JP | 2020201161 A | * | 12/2020 |
| KR | 102047264 B1 | * | 11/2019 |

* cited by examiner

*Primary Examiner* — Paresh Patel
(74) *Attorney, Agent, or Firm* — Li & Cai Intellectual Property (USA) Office

(57) ABSTRACT

A probe card device and a dual-arm probe are provided. The dual-arm probe has a probe length, and includes a bifurcation end portion and a testing end portion. The dual-arm probe has two broad side surfaces respectively arranged on two opposite sides thereof. The dual-arm probe has a separation slot that is recessed from a bifurcation opening of the bifurcation end portion toward the testing end portion and that penetrates from one of the two broad side surfaces to the other one, so that two branch arms of the dual-arm probe are defined by the separation slot and are spaced apart from each other. The separation slot has a slot length being 50% to 90% of the probe length. In a cross section of the two branch arms, an area of any one of the two branch arms is 90% to 110% of that of the other one.

8 Claims, 12 Drawing Sheets

PROBE CARD DEVICE AND DUAL-ARM PROBE

CROSS-REFERENCE TO RELATED PATENT APPLICATION

This application claims the benefit of priority to Taiwan Patent Application No. 109142031, filed on Nov. 30, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a dual-arm probe.

BACKGROUND OF THE DISCLOSURE

In order to satisfy circuit layout requirements of a space transformer, a conventional probe card device includes various probes. However, cross-sectional areas of the various probes are different and have a large difference therebetween, so that the various probes are provided with different electrically conductive properties (e.g., resistances) and different mechanical properties (e.g., contact forces).

SUMMARY OF THE DISCLOSURE

In response to the above-referenced technical inadequacy, the present disclosure provides a probe card device and a dual-arm probe to effectively improve on the issues associated with conventional conductive probes.

In one aspect, the present disclosure provides a probe card device, which includes a first guiding board unit, a second guiding board unit spaced apart from the first guiding board unit, and a plurality of dual-arm probes that pass through the first guiding board unit and the second guiding board unit. Each of the dual-arm probes defines a longitudinal direction and has a probe length in the longitudinal direction, and an outer surface of each of the dual-arm probes includes two broad side surfaces that are respectively arranged on two opposite sides thereof and that are parallel to the longitudinal direction. Each of the dual-arm probes includes a bifurcation end portion and a testing end portion. In each of the dual-arm probes, the bifurcation end portion is located at an outer side of the first guiding board unit away from the second guiding board unit, and the bifurcation end portion has a bifurcation opening. In each of the dual-arm probes, the testing end portion is located at an outer side of the second guiding board unit away from the first guiding board unit and is configured to detachably abut against a device under test (DUT). Each of the dual-arm probes has a separation slot that is recessed from the bifurcation opening toward the testing end portion along the longitudinal direction and that penetrates from one of the two broad side surfaces to another one of the two broad side surfaces, so that two branch arms of each of the dual-arm probes are defined by the separation slot and are spaced apart from each other by a distance. The separation slot of each of the dual-arm probes has a slot length in the longitudinal direction that is 50% to 90% of the probe length, and the distance of one of the dual-arm probes is different from the distance of another one of the dual-arm probes. In a cross section of the two branch arms of each of the dual-arm probes perpendicular to the longitudinal direction, a cross-sectional area of any one of the two branch arms is 90% to 110% of a cross-sectional area of another one of the two branch arms.

In another aspect, the present disclosure provides a dual-arm probe defining a longitudinal direction and having a probe length in the longitudinal direction. The dual-arm probe has two broad side surfaces that are respectively arranged on two opposite sides thereof and that are parallel to the longitudinal direction. The dual-arm probe includes a bifurcation end portion having a bifurcation opening and a testing end portion that is configured to detachably abut against a device under test (DUT). The bifurcation end portion and the testing end portion are respectively arranged on two opposite ends of the dual-arm probe. The dual-arm probe has a separation slot that is recessed from the bifurcation opening toward the testing end portion along the longitudinal direction and that penetrates from one of the two broad side surfaces to another one of the two broad side surfaces, so that two branch arms of the dual-arm probe are defined by the separation slot and are spaced apart from each other by a distance. The separation slot of the dual-arm probe has a slot length in the longitudinal direction that is 50% to 90% of the probe length. In a cross section of the two branch arms of the dual-arm probe perpendicular to the longitudinal direction, a cross-sectional area of any one of the two branch arms is 90% to 110% of a cross-sectional area of another one of the two branch arms.

Therefore, the dual-arm probes of the probe card device of the present disclosure can have different shapes or structural configurations based on the same structural design (e.g., the distance of one of the dual-arm probes can be different from the distance of another one of the dual-arm probes), thereby satisfying a circuit layout requirement of a space transformer.

Moreover, the electrically conductive property (e.g., a resistance) and the mechanical property (e.g., a contact force) of the dual-arm probes in the present disclosure can be approximately the same by the structural design of the two branch arms of each of the dual-arm probes (e.g., the cross-sectional area of any one of the two branch arms is 90% to 110% of the cross-sectional area of another one of the two branch arms).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
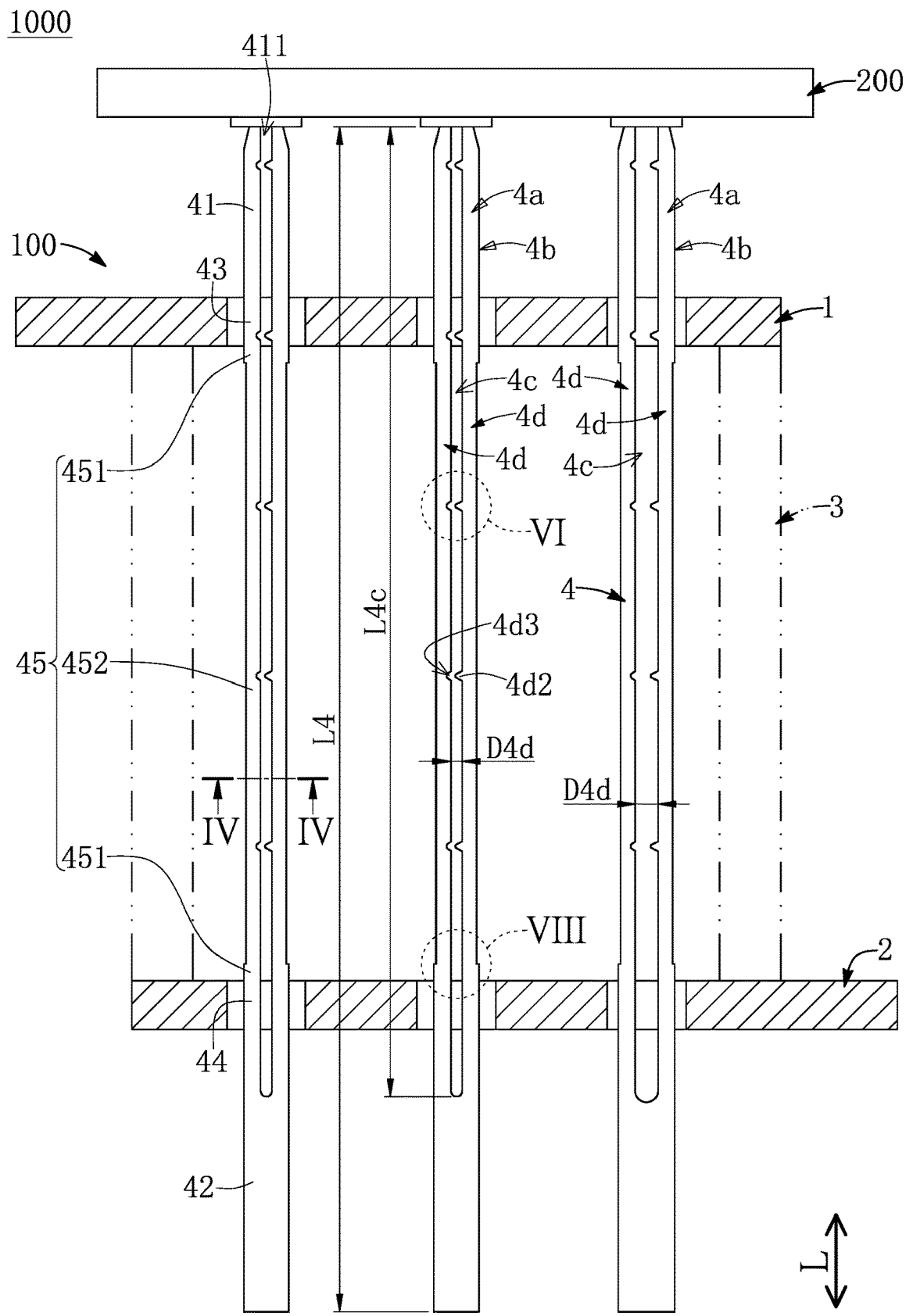
FIG. 1 is a cross-sectional view of a probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
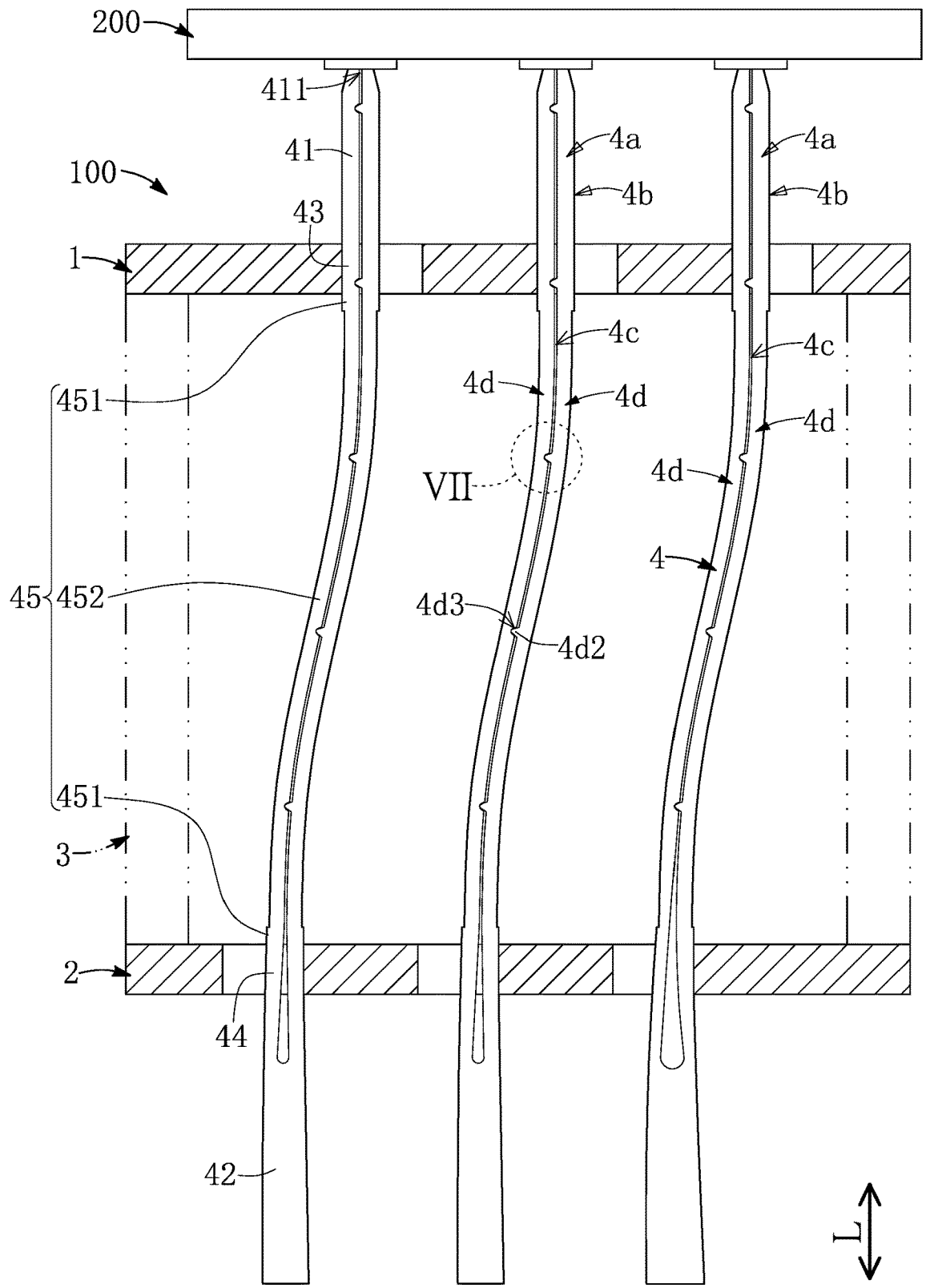
FIG. 2 is a cross-sectional view showing the probe card device of FIG. 1 when a first guiding board unit and a second guiding board unit are in a staggered arrangement.

Referring to FIG. 1 to FIG. 8, a first embodiment of the present disclosure provides a probe card device 1000. As shown in FIG. 1 and FIG. 2, the probe card device 1000 includes a probe head 100 and a space transformer 200 that is connected to one side of the probe head 100 (e.g., a top side of the probe head 100 shown in FIG. 1). Another side of the probe head 100 (e.g., a bottom side of the probe head 100 shown in FIG. 1) is configured to abut against a device under test (DUT) (e.g., a semiconductor wafer that is not shown in the drawings).

It should be noted that in order to clearly describe the structural and connection relationship of each component of the probe card device 1000, the drawings of the present embodiment only show a portion of the probe card device 1000, but the present disclosure is not limited thereto. The following description describes the structural and connection relationship of each component of the probe card device 1000.

As shown in FIG. 1, the probe head 100 includes a first guiding board unit 1, a second guiding board unit 2 spaced apart from the first guiding board unit 1, a spacer 3 sandwiched between the first guiding board unit 1 and the second guiding board unit 2, and a plurality of dual-arm probes 4 that pass through (and are retained by) the first guiding board unit 1 and the second guiding board unit 2.

It should be noted that the dual-arm probes 4 in the present embodiment are described in cooperation with the first guiding board unit 1, the second guiding board unit 2, and the spacer 3, but the present disclosure is not limited thereto. For example, in other embodiments of the present disclosure not shown in the drawings, the dual-arm probe 4 can be independently used (e.g., sold) or can be used in cooperation with other components.

In the present embodiment, the first guiding board unit 1 includes one first guiding board, and the second guiding board unit 2 includes one second guiding board. However, in other embodiments of the present disclosure not shown in the drawings, the first guiding board unit 1 can include a plurality of first guiding boards and at least one spacing sheet that is sandwiched between any two of the first guiding boards adjacent to each other, and the second guiding board unit 2 can include a plurality of second guiding boards and at least one spacing sheet that is sandwiched between any two of the second guiding boards adjacent to each other. Furthermore, the first guiding boards are in a staggered arrangement, the second guiding boards are in a staggered arrangement, and the first guiding board unit 1 and the second guiding board unit 2 are staggered with respect to each other.

Moreover, the spacer 3 can be an annular structure and is sandwiched between a peripheral portion of the first guiding board unit 1 and a peripheral portion of the second guiding board unit 2, but the present disclosure is not limited thereto. For example, in other embodiments of the present disclosure not shown in the drawings, the spacer 3 of the probe card device 1000 can be omitted or can be replaced by other components.

As the dual-arm probes 4 in the present embodiment are formed according to the substantially same structural design so as to have at least two different shapes, the following description discloses the structure of just one of the dual-arm probes 4 for the sake of brevity, but the present disclosure is not limited thereto. For example, in other embodiments of the present disclosure not shown in the drawings, the probe head 100 can include a plurality of dual-arm probes 4 having at least two different shapes and at least one conventional conductive probe that is in a straight shape.

Moreover, in order to clearly describe the structure of the dual-arm probe 4, the following description describes the dual-arm probe 4 when the first guiding board unit 1 and the second guiding board unit 2 are not staggered with respect to each other.

Figure 3:
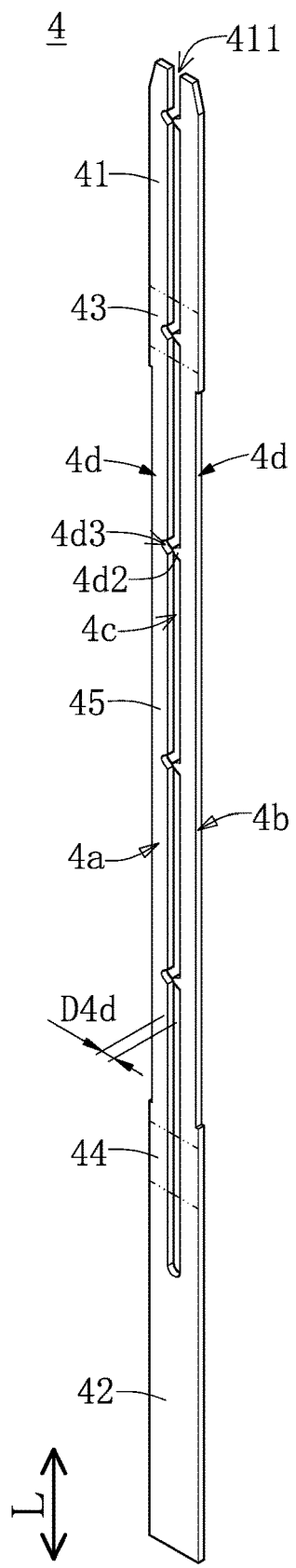
FIG. 3 is a perspective view showing a dual-arm probe of FIG. 1.

As shown in FIG. 1 and FIG. 3, the dual-arm probe 4 is integrally formed as a single one-piece structure, and the dual-arm probe 4 is in a substantial straight shape defining a longitudinal direction L. The dual-arm probe 4 has a probe length L4 in the longitudinal direction L, and an outer surface of the dual-arm probe 4 includes two broad side surfaces 4a and two narrow side surfaces 4b. The two broad side surfaces 4a and the two narrow side surfaces 4b are parallel to the longitudinal direction L, the two broad side surfaces 4a are respectively arranged on two opposite sides of the dual-arm probe 4, and the two narrow side surfaces 4b are respectively arranged on another two opposite sides of the dual-arm probe 4.

Moreover, the dual-arm probe 4 includes a bifurcation end portion 41, a testing end portion 42, a first connection portion 43 connected to the bifurcation end portion 41, a second connection portion 44 connected to the testing end portion 42, and a stroke portion 45 that connects the first connection portion 43 and the second connection portion 44. The bifurcation end portion 41 and the testing end portion 42 are respectively arranged on two opposite ends of the dual-arm probe 4. In other words, the dual-arm probe 4 sequentially includes the bifurcation end portion 41, the first connection portion 43, the stroke portion 45, the second connection portion 44, and the testing end portion 42, but the present disclosure is not limited thereto.

The bifurcation end portion 41 is located at an outer side of the first guiding board unit 1 (e.g., an upper side of the first guiding board unit 1 shown in FIG. 1) away from the second guiding board unit 2, and the bifurcation end portion 41 is configured to be abutted against the space transformer 200 that is located adjacent to the first guiding board unit 1. The testing end portion 42 is located at an outer side of the second guiding board unit 2 (e.g., a lower side of the second guiding board unit 2 shown in FIG. 1) away from the first guiding board unit 1, and the testing end portion 42 is configured to detachably abut against the DUT that is located adjacent to the second guiding board unit 2. Moreover, the first connection portion 43 is located in the first guiding board unit 1, the second connection portion 44 is located in the second guiding board unit 2, and the stroke portion 45 is located between the first guiding board unit 1 and the second guiding board unit 2.

Specifically, the bifurcation end portion 41 has a bifurcation opening 411. The dual-arm probe 4 has a separation slot 4c that is recessed from the bifurcation opening 411 toward the testing end portion 42 along the longitudinal direction L and that penetrates from one of the two broad side surfaces 4a to another one of the two broad side surfaces 4a, so that two branch arms 4d of the dual-arm probe 4 are defined by the separation slot 4c and are spaced apart from each other by a distance D4d.

The distance D4d of one of the dual-arm probes 4 can be different from the distance D4d of another one of the dual-arm probes 4, so that based on the same structural design, the dual-arm probes 4 can have different shapes for satisfying a circuit layout of the space transformer 200.

Figure 4:
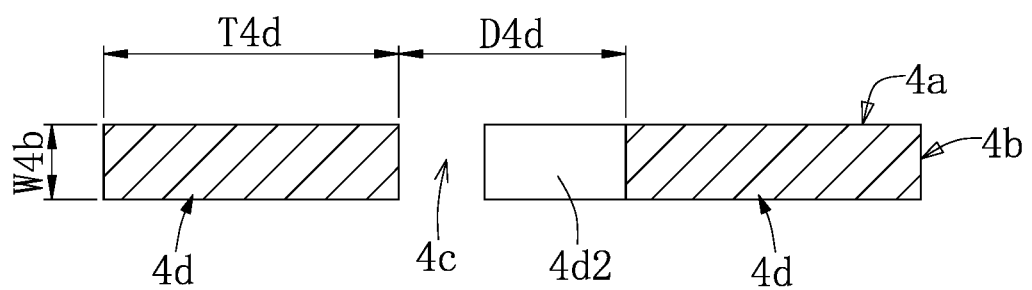
FIG. 4 is a cross-sectional view taken along line IV-IV of FIG. 1.

Moreover, the separation slot 4c of the dual-arm probe 4 has a slot length L4c in the longitudinal direction L that is 50% to 90% of the probe length L4. As shown in FIG. 1 and FIG. 4, in a cross section of the two branch arms 4d of the dual-arm probe 4 perpendicular to the longitudinal direction L, a cross-sectional area of any one of the two branch arms 4d is 90% to 110% (e.g., 100%) of a cross-sectional area of another one of the two branch arms 4d, and a thickness W4b between the two narrow side surfaces 4b is 20% to 100% of a thickness T4d between the two broad side surfaces 4a. It should be noted that the cross-sectional areas in the present embodiment do not include any rib 4d2 and any limiting notch 4d3.

Accordingly, in the dual-arm probes 4 having different shapes, a sum of the cross-sectional areas of the two branch arms 4d of each of the dual-arm probes 4 is approximately the same, so that the electrically conductive property (e.g., a resistance) and the mechanical property (e.g., a contact force) of the dual-arm probes 4 can be approximately the same. Specifically, in each of the dual-arm probes 4, the cross-sectional area of any one of the two branch arms 4d is preferably equal to the cross-sectional area of another one of the two branch arms 4d, so that the electrically conductive property and the mechanical property of the two branch arms 4d can be substantially the same.

It should be noted that the two branch arms 4d of any one of the dual-arm probes 4 can be formed with different structures for satisfying different design requirements. For example, at least one of the dual-arm probes 4 in the present embodiment can include at least one of the following technical features, but the present disclosure is not limited thereto. However, in other embodiments of the present disclosure not shown in the drawings, the dual-arm probe 4 does not include any one of the following technical features.

As shown in FIG. 1 and FIG. 3, the two branch arms 4d have a same length in the longitudinal direction L, and the two branch arms 4d are jointly abutted against the space transformer 200. In other words, the bifurcation opening 411 is recessed in a distal end of the bifurcation end portion 41, and the bifurcation opening 411 is substantially in spatial communication with the separation slot 4c along the longitudinal direction L.

Figure 5:
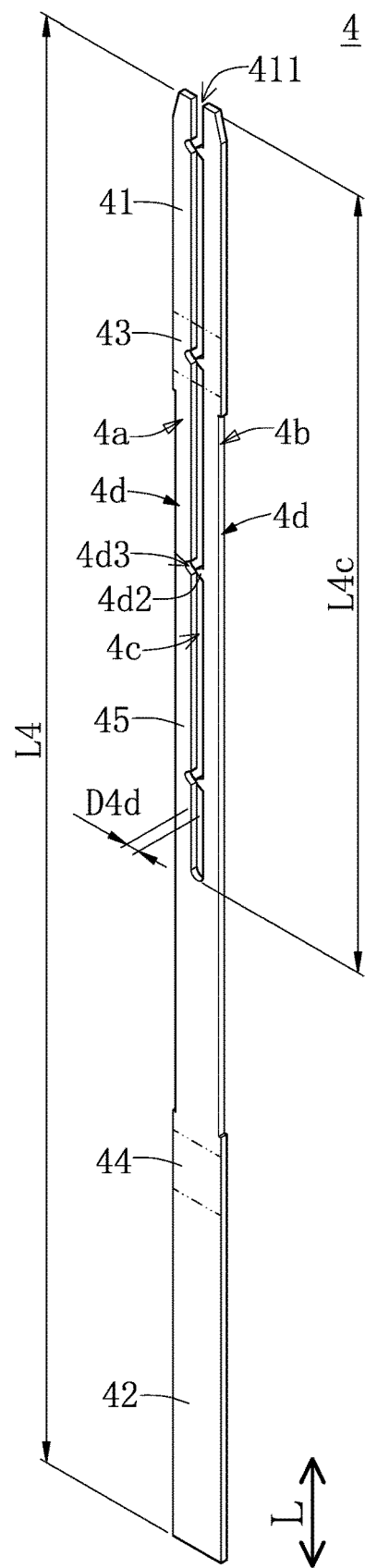
FIG. 5 is a perspective view showing the dual-arm probe in another configuration according to the first embodiment of the present disclosure.

Moreover, the separation slot 4c in the present embodiment is recessed from the bifurcation opening 411 to the second connection portion 44. In other words, a bottom of the separation slot 4c is located in the second guiding board unit 2, but the present disclosure is not limited thereto. For example, as shown in FIG. 5, the separation slot 4c of the at least one of the dual-arm probes 4 can be recessed from the bifurcation opening 411 to a substantial center part of the stroke portion 45.

Figure 6:
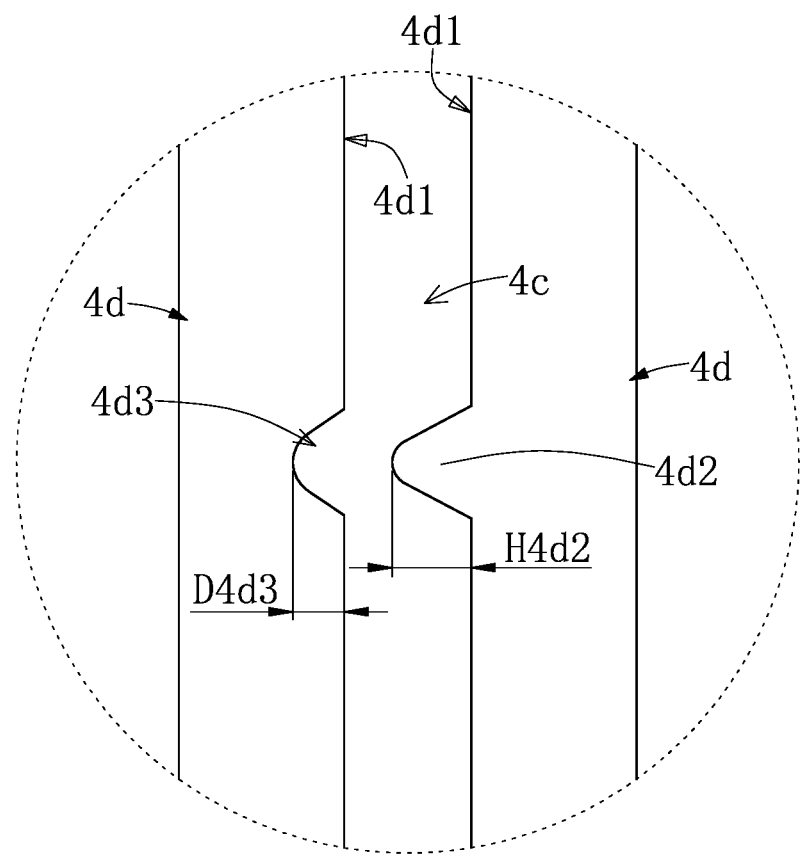
FIG. 6 shows an enlarged view of part VI of FIG. 1.
Figure 7:
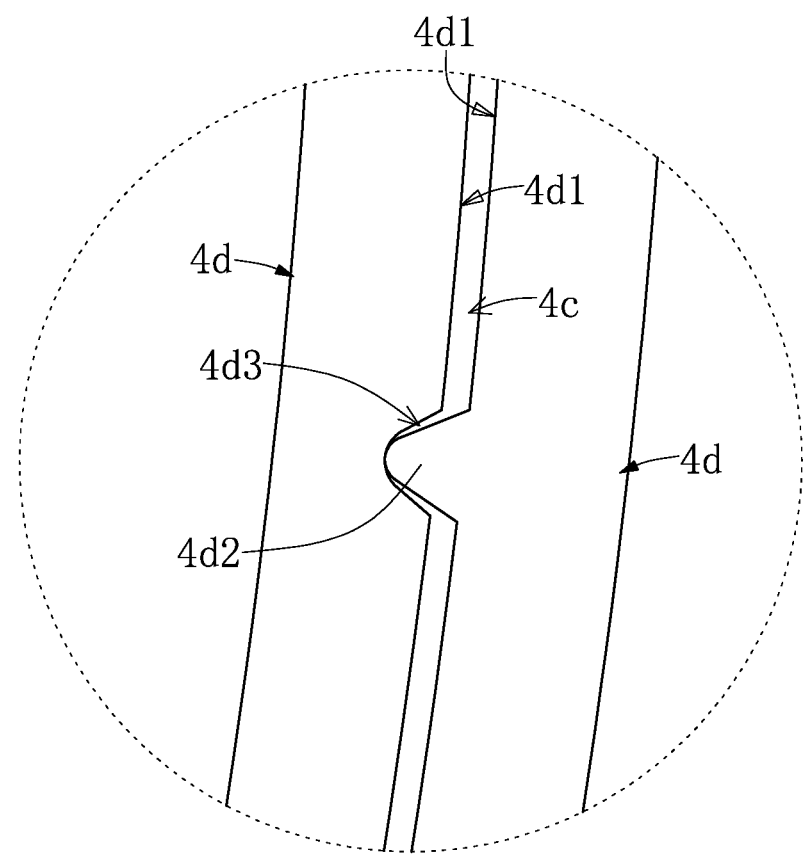
FIG. 7 shows an enlarged view of part VII of FIG. 2.

Specifically, as shown in FIG. 1, FIG. 6, and FIG. 7, the dual-arm probe 4 has at least one rib 4d2 protruding from one of two inner surfaces 4d1 of the two branch arms 4d thereof facing each other, and at least one limiting notch 4d3 is recessed in another one of the two inner surfaces 4d1 of the two branch arms 4d and has a depth D4d3 that is less than a height H4d2 of the at least one rib 4d2.

In the present embodiment, as shown in FIG. 1 and FIG. 6, a quantity of the at least one rib 4d2 is more than one, and a quantity of the at least one limiting notch 4d3 is also more than one. The ribs 4d2, which are spaced apart from each other, are formed on the inner surface 4d1 of one of the two branch arms 4d and are arranged in one row along the longitudinal direction L, and the notches 4d3 are recessed in the inner surface 4d1 of another one of the two branch arms 4d and respectively face toward the ribs 4d2, but the present disclosure is not limited thereto. For example, in other embodiments of the present disclosure not shown in the drawings, each of the two branch arms 4d of the dual-arm probe 4 can include at least one rib 4d2 and at least one limiting notch 4d3, and any one of the ribs 4d2 corresponds in position to one of the limiting notches 4d3; or, at least one of the two branch arms 4d of the dual-arm probe 4 can only include at least one rib 4d2 and does not include any limiting notch 4d3.

Accordingly, as shown in FIG. 1 and FIG. 2, when the first guiding board unit 1 and the second guiding board unit 2 are in a slantingly staggered arrangement, in the at least one of the dual-arm probes 4 having the at least one rib 4d2, the two branch arms 4d are spaced apart from each other through the at least one rib 4d2 (and the corresponding limiting notch 4d3).

Figure 8:
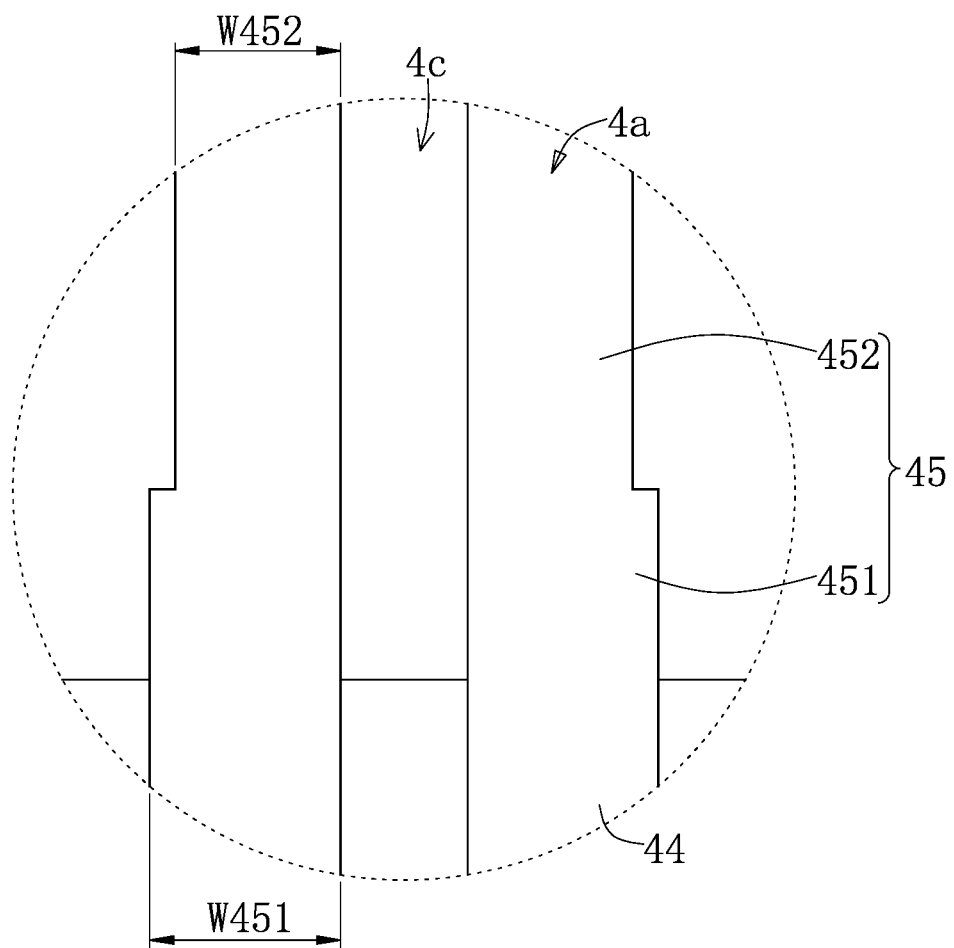
FIG. 8 shows an enlarged view of part VIII of FIG. 1.

In addition, as shown in FIG. 1 and FIG. 8, in each of the dual-arm probes 4, the stroke portion 45 has two distal parts 451 and a main part 452 between the two distal parts 451, and a width W451 of each of the two distal parts 451 on any one of the two broad side surfaces 4a is greater than a width W452 of the main part 452 on any one of the two broad side surfaces 4a.

Second Embodiment

Figure 9:
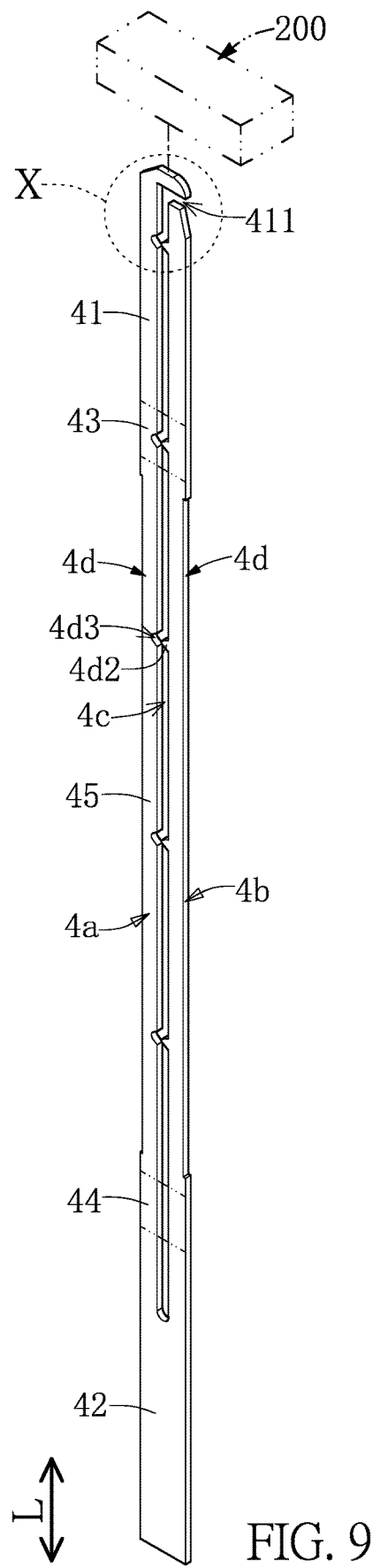
FIG. 9 is a perspective view of a dual-arm probe according to a second embodiment of the present disclosure.
Figure 10:
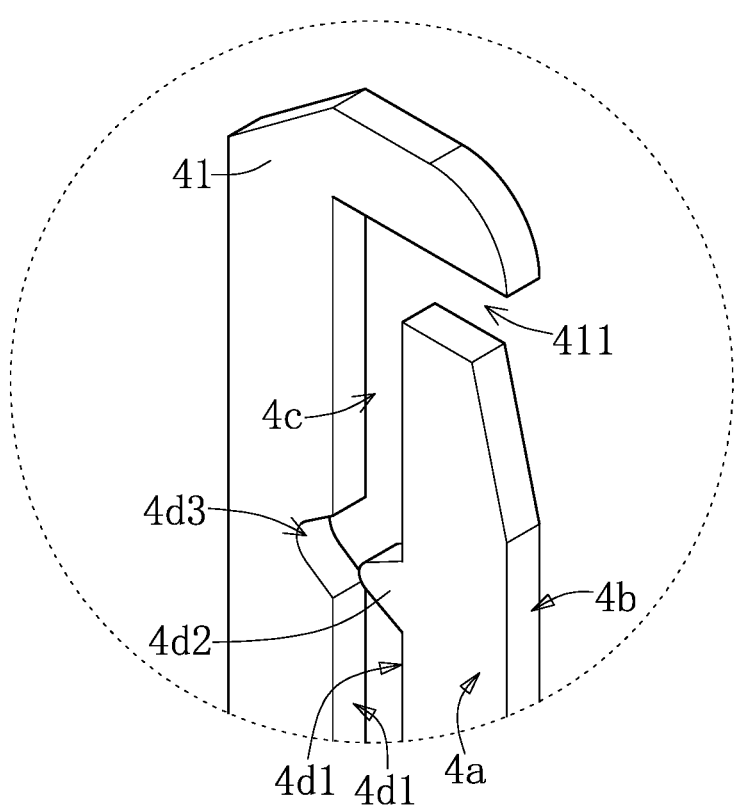
FIG. 10 shows an enlarged view of part X of FIG. 9.

Referring to FIG. 9 and FIG. 10, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In at least one of the dual-arm probes 4 of the present embodiment, the two branch arms 4d have different lengths in the longitudinal direction L, and only one of the two branch arms 4d is abutted against the space transformer 200. In other words, the bifurcation opening 411 of the bifurcation end portion 41 is recessed in one of the two narrow side surfaces 4b, and the bifurcation opening 411 is substantially in spatial communication with the separation slot 4c along a direction perpendicular to the longitudinal direction L.

Third Embodiment

Figure 11:
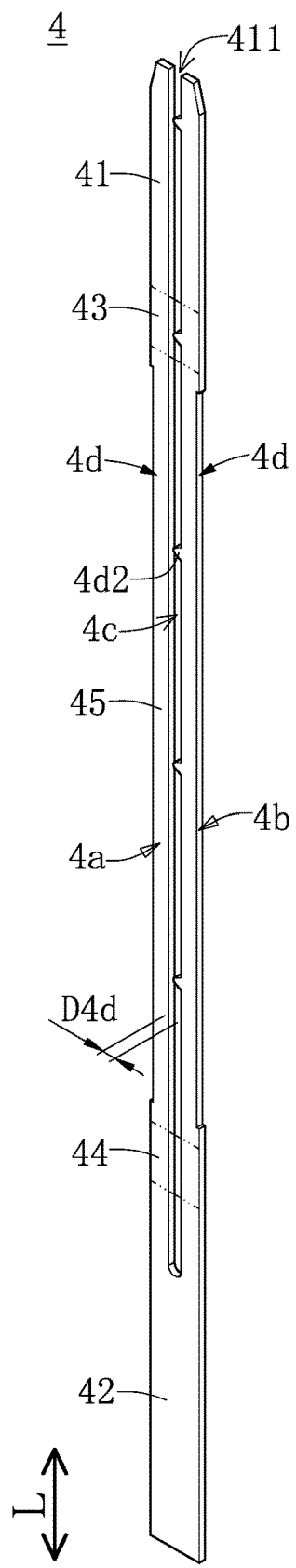
FIG. 11 is a perspective view of a dual-arm probe according to a third embodiment of the present disclosure.
Figure 12:
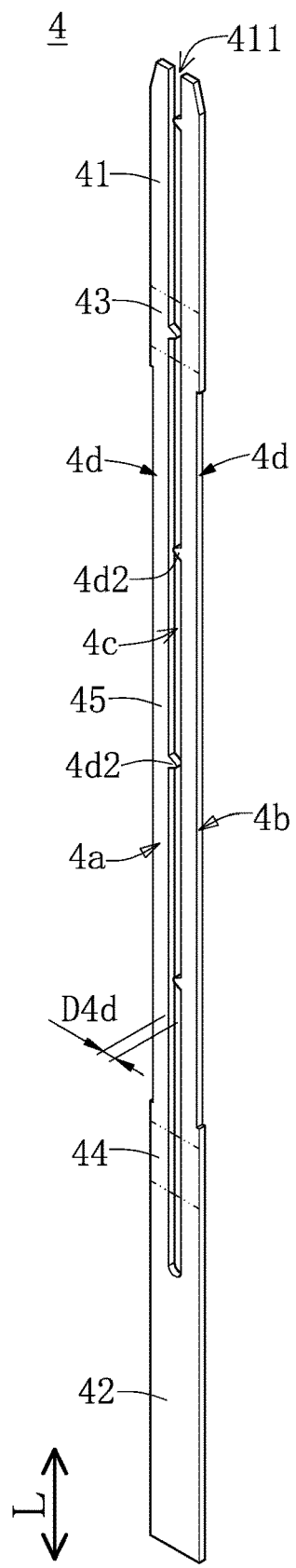
FIG. 12 is a perspective view showing the dual-arm probe in another configuration according to the third embodiment of the present disclosure.

Referring to FIG. 11 and FIG. 12, a third embodiment of the present disclosure is similar to the first embodiment of the present disclosure. For the sake of brevity, descriptions of the same components in the first and third embodiments of the present disclosure will be omitted herein, and the following description only discloses different features between the first and third embodiments.

As shown in FIG. 11 of the present embodiment, the dual-arm probe 4 has at least one rib 4d2 protruding from only one of the two inner surfaces 4d1 of the two branch arms 4d thereof facing each other, and does not have any limiting notch 4d3.

As shown in FIG. 12 of the present embodiment, the dual-arm probe 4 has a plurality of ribs 4d2 respectively protruding from the two inner surfaces 4d1 of the two branch arms 4d thereof facing each other, and does not have any limiting notch 4d3.

Beneficial Effects of the Embodiments

In conclusion, the dual-arm probes of the probe card device of the present disclosure can have different shapes or structural configurations based on the same structural design (e.g., the distance of one of the dual-arm probes can be different from the distance of another one of the dual-arm probes), thereby satisfying the circuit layout requirement of the space transformer.

Moreover, the electrically conductive property (e.g., the resistance) and the mechanical property (e.g., the contact force) of the dual-arm probes in the present disclosure can be approximately the same by the structural design of the two branch arms of each of the dual-arm probes (e.g., the cross-sectional area of any one of the two branch arms is 90% to 110% of the cross-sectional area of another one of the two branch arms).

In addition, at least one of the dual-arm probes of the probe card device in the present disclosure is provided with at least one rib (and a corresponding limiting notch), so that when the first guiding board unit and the second guiding board unit are in a slantingly staggered arrangement, the two branch arms of the at least one of the dual-arm probes can be spaced apart from each other through the at least one rib (and the corresponding limiting notch), which can avoid changing the mechanical property of the two branch arms.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
    a first guiding board unit and a second guiding board unit that is spaced apart from the first guiding board unit; and
    a plurality of dual-arm probes passing through the first guiding board unit and the second guiding board unit, wherein each of the dual-arm probes defines a longitudinal direction and has a probe length in the longitudinal direction, and an outer surface of each of the dual-arm probes includes two broad side surfaces that are respectively arranged on two opposite sides thereof and that are parallel to the longitudinal direction, and wherein each of the dual-arm probes includes:
        a bifurcation end portion located at an outer side of the first guiding board unit away from the second guiding board unit, wherein the bifurcation end portion has a bifurcation opening; and
        a testing end portion located at an outer side of the second guiding board unit away from the first guiding board unit and configured to detachably abut against a device under test (DUT);
    wherein each of the dual-arm probes has a separation slot that is recessed from the bifurcation opening toward the testing end portion along the longitudinal direction and that penetrates from one of the two broad side surfaces to another one of the two broad side surfaces, so that two branch arms of each of the dual-arm probes are defined by the separation slot and are spaced apart from each other by a distance, and wherein the separation slot of each of the dual-arm probes has a slot length in the longitudinal direction that is 50% to 90% of the probe length, and the distance of one of the dual-arm probes is different from the distance of another one of the dual-arm probes;
    wherein, in a cross section of the two branch arms of each of the dual-arm probes perpendicular to the longitudinal direction, a cross-sectional area of any one of the two branch arms is 90% to 110% of a cross-sectional area of another one of the two branch arms.

2. The probe card device according to claim 1, wherein at least one of the dual-arm probes has at least one rib protruding from one of two inner surfaces of the two branch arms thereof facing each other, and wherein, when the first guiding board unit and the second guiding board unit are in a slantingly staggered arrangement, the two branch arms of the at least one of the dual-arm probes are spaced apart from each other through the at least one rib.

3. The probe card device according to claim 2, wherein in the at least one of the dual-arm probes, at least one limiting notch is recessed in another one of the two inner surfaces of the two branch arms and has a depth that is less than a height of the at least one rib.

4. The probe card device according to claim 1, wherein a portion of each of the dual-arm probes located in the first guiding board unit is defined as a first connection portion, and a portion of each of the dual-arm probes located in the second guiding board unit is defined as a second connection portion, and wherein in at least one of the dual-arm probes, the separation slot is recessed from the bifurcation opening to the second connection portion.

5. The probe card device according to claim 1, wherein a portion of each of the dual-arm probes located between the first guiding board unit and the second guiding board unit is defined as a stroke portion, and wherein in each of the dual-arm probes, the stroke portion has two distal parts and a main part between the two distal parts, and a width of each of the two distal parts on any one of the two broad side surfaces is greater than a width of the main part on any one of the two broad side surfaces.

6. The probe card device according to claim 1, further comprising a space transformer located adjacent to the first guiding board unit, and wherein in at least one of the dual-arm probes, the two branch arms have different lengths in the longitudinal direction, and only one of the two branch arms abuts against the space transformer.

7. The probe card device according to claim 1, further comprising a space transformer located adjacent to the first guiding board unit, and wherein in at least one of the dual-arm probes, the two branch arms have a same length in the longitudinal direction, and the two branch arms jointly abut against the space transformer.

8. The probe card device according to claim 1, wherein the outer surface of each of the dual-arm probes includes two narrow side surfaces that are respectively arranged on another two opposite sides thereof and that are parallel to the longitudinal direction, and wherein in any one of the two branch arms of each of the dual-arm probes, a thickness between the two narrow side surfaces is 20% to 100% of a thickness between the two broad side surfaces.

\* \* \* \* \*